(12) United States Patent
Gong et al.

(10) Patent No.: US 12,453,223 B2
(45) Date of Patent: Oct. 21, 2025

(54) DISPLAY PANEL AND MANUFACTURING METHOD THEREOF, DISPLAY APPARATUS AND SPLICING DISPLAY APPARATUS

(71) Applicants: BOE MLED Technology Co., Ltd., Beijing (CN); BOE TECHNOLOGY GROUP CO., LTD., Beijing (CN)

(72) Inventors: Linhui Gong, Beijing (CN); Liang Sun, Beijing (CN); Chao Liu, Beijing (CN); Sha Feng, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 852 days.

(21) Appl. No.: 17/556,224

(22) Filed: Dec. 20, 2021

(65) Prior Publication Data

US 2022/0302362 A1 Sep. 22, 2022

(30) Foreign Application Priority Data

Mar. 16, 2021 (CN) .......................... 202110283115.6

(51) Int. Cl.
*H10H 20/857* (2025.01)
*H10H 20/01* (2025.01)
*H10H 29/14* (2025.01)

(52) U.S. Cl.
CPC ........ *H10H 20/857* (2025.01); *H10H 29/142* (2025.01); *H10H 20/0364* (2025.01)

(58) Field of Classification Search
CPC ................... H01L 33/62; H01L 27/156; H01L 2933/0066; H01L 25/0753; H01L 25/165;
(Continued)

(56) References Cited

U.S. PATENT DOCUMENTS 6,383,269 B1 * 5/2002 Toben ...................... H05K 3/24
106/1.23
6,756,252 B2 * 6/2004 Nakanishi ............... H01L 24/24
438/118

(Continued)

FOREIGN PATENT DOCUMENTS

CN 107995802 A 5/2018
CN 110444684 A 11/2019

(Continued)

OTHER PUBLICATIONS

China Patent Office, CN202110283115.6 First Office Action issued on Dec. 13, 2021.

(Continued)

*Primary Examiner* — William B Partridge
*Assistant Examiner* — David Paul Sedorook
(74) *Attorney, Agent, or Firm* — HOUTTEMAN LAW LLC (57) ABSTRACT

The present disclosure provides a display panel and a manufacturing method thereof, a display apparatus and a splicing display apparatus. The display panel includes: a back plate, at least one connection lead and a first protection layer. Each of the at least one connection lead includes a main conductive layer. The first protection layer includes a first portion on two sides of the main conductive layer of the connection lead in a width direction thereof.

15 Claims, 7 Drawing Sheets

(58) Field of Classification Search
CPC .. H01L 25/167; H10H 20/857; H10H 29/142; H10H 20/0364; H10H 20/8506; H10H 20/036; G09F 9/33

See application file for complete search history.

(56) References Cited

U.S. PATENT DOCUMENTS

| | | | |
|---|---|---|---|
| 7,968,879 B2 * | 6/2011 | Yamazaki | H01L 29/78696 257/E33.009 |
| 2011/0242468 A1 * | 10/2011 | Choi | G02F 1/1393 427/508 |
| 2013/0009148 A1 * | 1/2013 | Yamazaki | H01L 29/24 257/43 |
| 2015/0123106 A1 * | 5/2015 | Yasumoto | H10K 71/80 156/701 |
| 2015/0325631 A1 * | 11/2015 | Yamazaki | H01L 29/24 257/40 |
| 2020/0168697 A1 * | 5/2020 | Jang | H01L 27/156 |
| 2020/0235189 A1 * | 7/2020 | Bae | H10K 59/131 |
| 2021/0336078 A1 * | 10/2021 | Fan | H01L 25/167 |
| 2021/0336107 A1 * | 10/2021 | Jiang | H01L 33/005 |

FOREIGN PATENT DOCUMENTS

| | | |
|---|---|---|
| CN | 211428157 U | 9/2020 |
| CN | 212256800 U | 12/2020 |
| TW | 200521588 A | 7/2005 |

OTHER PUBLICATIONS

China Patent Office, CN202110283115.6 Second Office Action issued on May 16, 2022.

\* cited by examiner

DISPLAY PANEL AND MANUFACTURING METHOD THEREOF, DISPLAY APPARATUS AND SPLICING DISPLAY APPARATUS

CROSS-REFERENCE TO RELATED APPLICATIONS

The present application claims the priority of the Chinese Patent Application No. 202110283115.6, filed on Mar. 16, 2021, the content of which is incorporated herein by reference in its entirety.

TECHNICAL FIELD

The present disclosure relates to the field of display technology, and in particular, to a display panel and a manufacturing method thereof, a display apparatus and a splicing display apparatus.

BACKGROUND

A mini LED (mini Light-Emitting Diode) display apparatus/a micro LED (micro Light-Emitting Diode) display apparatus has the advantages of high brightness, clear display picture, low power consumption and the like, has better application prospect, and may be applied to a large-scale splicing display apparatus.

In a splicing display apparatus, the size of a splicing seam is an important factor affecting display quality, and therefore, the display apparatus with a narrow bezel becomes one of the development trends. At present, in order to narrow the bezel of the display apparatus, a side surface routing is mostly used in the mini LED display apparatus to implement electrical connection between the electrical devices on two opposite surfaces of a display panel.

SUMMARY

According to an aspect of the present disclosure, a display panel is provided. The display panel includes: a back plate including a first main surface and a second main surface opposite to each other, and at least one side surface connecting between the first main surface and the second main surface, wherein the at least one side surface includes a selected side surface; at least one connection lead on the selected side surface, wherein each of the at least one connection lead includes a main conductive layer; and a first protection layer including a first portion on two sides of the main conductive layer of the connection lead in a width direction of the connection lead, wherein the width direction of the connection lead is perpendicular to an extending direction of the connection lead.

In some embodiments, a material of the first protection layer includes silicon nitride.

In some embodiments, the display panel further includes a plurality of light emitting devices on the second main surface, wherein the connection lead extends and reaches to the first main surface and the second main surface, and is connected to a corresponding one of the plurality of light emitting devices; and the first protection layer further includes a second portion and a third portion, the second portion is located on the two sides of the main conductive layer of a part on the first main surface and on the second main surface of the connection lead, and the third portion is located in a gap between the parts, on the first main surface, on the selected side surface, and on the second main surface, of every two adjacent connection leads of the at least one connection lead, and is located on a side of the connection lead away from a surface on which the connection lead is located.

In some embodiments, in a direction perpendicular to a surface, of the first main surface, the selected side surface, and the second main surface, on which the connection lead is located, the third portion has a thickness at the gap in a range from 0.2 µm to 0.5 µm, and a thickness at the connection lead in a range from 0.2 µm to 0.5 µm.

In some embodiments, the connection lead further includes a first buffer conductive layer and a second buffer conductive layer; the first buffer conductive layer, the main conductive layer and the second buffer conductive layer are sequentially stacked on the back plate; adhesiveness between the first buffer conductive layer and the back plate is greater than that between the main conductive layer and the back plate; and oxidation resistance of the second buffer conductive layer is greater than that of the main conductive layer.

In some embodiments, a material of the first buffer conductive layer and the second buffer conductive layer includes at least one of titanium, chromium, molybdenum, or molybdenum niobium alloy; and a material of the main conductive layer includes copper, the main conductive layer has a thickness in a range from 0.4 µm to 1 µm in a direction perpendicular to a surface on which the main conductive layer is located, the first buffer conductive layer has a thickness in a range from 30 nm to 70 nm in a direction perpendicular to a surface on which the first buffer conductive layer is located, and the second buffer conductive layer has a thickness in a range from 50 nm to 120 nm in a direction perpendicular to a surface on which the second buffer conductive layer is located.

In some embodiments, the display panel further includes a protection adhesive layer covering the first protection layer.

In some embodiments, a material of the first protection layer includes nickel-phosphorous alloy and gold.

In some embodiments, a thickness of the first portion in the width direction of the connection lead is in a range from 1 µm to 1.6 µm.

In some embodiments, the display panel further includes a plurality of light emitting devices on the second main surface, wherein the connection lead extends and reaches to the first main surface and the second main surface, and is connected to a corresponding one of the plurality of light emitting devices, and the display panel further includes a second protection layer at least covering the connection lead and the first protection layer, and a material of the second protection layer includes silicon nitride.

In some embodiments, the first protection layer further includes a second portion on two sides of the main conductive layer of a part on the first main surface and on the second main surface of the connection lead in the width direction of the connection lead.

In some embodiments, the first protection layer further includes a fifth portion on a side of the connection lead away from a surface on which the connection lead is located, the connection lead further includes a first buffer conductive layer, and the first buffer conductive layer and the main conductive layer are sequentially stacked on the back plate; and adhesiveness between the first buffer conductive layer and the back plate is greater than that between the main conductive layer and the back plate.

In some embodiments, the connection lead further includes a first buffer conductive layer and a second buffer conductive layer; the first buffer conductive layer, the main conductive layer and the second buffer conductive layer are sequentially stacked on the back plate; adhesiveness between the first buffer conductive layer and the back plate is greater than that between the main conductive layer and the back plate; and oxidation resistance of the second buffer conductive layer is greater than that of the main conductive layer.

In some embodiments, a material of the first buffer conductive layer and the second buffer conductive layer includes at least one of titanium, chromium, molybdenum, or molybdenum niobium alloy; and a material of the main conductive layer includes copper, the main conductive layer has a thickness in a range from 0.4 µm to 1 µm in a direction perpendicular to a surface on which the main conductive layer is located, the first buffer conductive layer has a thickness in a range from 30 nm to 70 nm in a direction perpendicular to a surface on which the first buffer conductive layer is located, and the second buffer conductive layer has a thickness in a range from 50 nm to 120 nm in a direction perpendicular to a surface on which the second buffer conductive layer is located.

In some embodiments, the display panel further includes a protection adhesive layer at least covering the first protection layer and the second protection layer.

According to an aspect of the present disclosure, a display apparatus is provided. The display apparatus includes: a display panel, including: a back plate including a first main surface and a second main surface opposite to each other, and at least one side surface connecting between the first main surface and the second main surface, wherein the at least one side surface includes a selected side surface; at least one connection lead on the selected side surface, wherein each of the at least one connection lead includes a main conductive layer; and a first protection layer including a first portion on two sides of the main conductive layer of the connection lead in a width direction of the connection lead, wherein the width direction of the connection lead is perpendicular to an extending direction of the connection lead; and a driving chip on the first main surface of the back plate of the display panel, wherein the driving chip is electrically coupled to a plurality of light emitting devices of the display panel through the at least one connection lead of the display panel, respectively.

According to an aspect of the present disclosure, a splicing display apparatus is provided. The splicing display apparatus includes a plurality of display apparatuses, each of which includes the above display apparatus, wherein the plurality of display apparatuses are assembled together by splicing.

According to an aspect of the present disclosure, a method for manufacturing a display panel is provided. The method includes: providing a back plate, such that the back plate includes a first main surface and a second main surface opposite to each other, at least one side surface connecting between the first main surface and the second main surface, and the at least one side surface includes a selected side surface; forming at least one connection lead on the selected side surface, such that each of the at least one connection lead includes a main conductive layer; and forming a first protection layer, such that the first protection layer includes a first portion on two sides of the main conductive layer of the connection lead in a width direction of the connection lead, and the width direction of the connection lead is perpendicular to an extending direction of the connection lead.

In some embodiments, the forming a first protection layer includes: sputtering a silicon nitride material on two sides of the main conductive layer of the connection lead in the width direction of the connection lead to form the first protection layer.

In some embodiments, the forming a first protection layer includes: performing an electroless nickel/immersion gold process on the main conductive layer to form the first protection layer on two sides of the main conductive layer of the connection lead in the width direction of the connection lead.

BRIEF DESCRIPTION OF DRAWINGS

In order to more clearly illustrate the embodiments of the present disclosure or the technical solutions in the related art, the drawings to be used in the embodiments or in the description of the related art will be briefly described below. It is obvious that the drawings in the following description are only some embodiments of the present disclosure, and other drawings could be obtained by those skilled in the art without creative efforts based on the drawings.

DETAIL DESCRIPTION OF EMBODIMENTS

In order to make the above objects, features and advantages of the present disclosure more apparent, the technical solutions in the embodiments of the present disclosure will be clearly and completely described below in combination with the accompanying drawings in the embodiments of the present disclosure. Obviously, the described embodiments are only some of the embodiments of the present disclosure, not all of the embodiments. Based on the embodiments in the present disclosure, all other embodiments obtained by those skilled in the art without creative work belong to the protection scope of the present disclosure.

At present, in order to narrow a bezel of a display apparatus, a side surface routing is mostly used in a mini LED display apparatus to implement electrical connection between the electrical devices on two opposite surfaces of a display panel. After a side surface connection lead is implemented by an etching process, the included metal in the side surface connection lead is exposed from an etched interface. The metal gradually is corroded and turns black under the condition of long time contact with water and oxygen, and the corroded part of the metal gradually permeates inwards from the exposed interface, resulting in increasing resistance of the side surface connection lead and even a broken connection lead.

Figure 1:
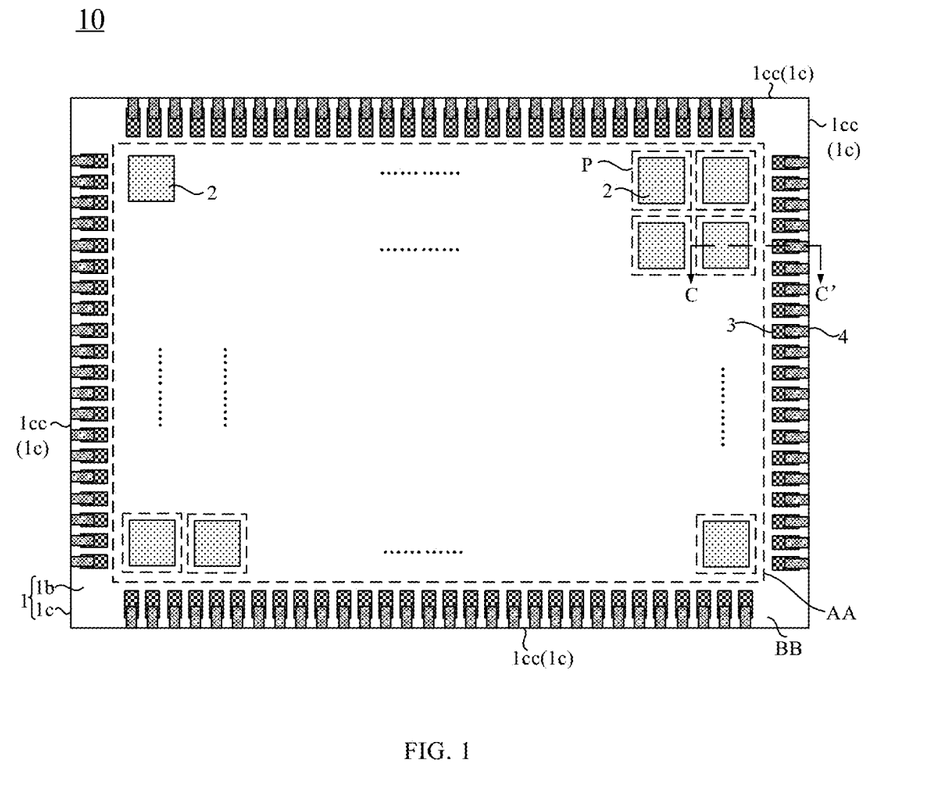
FIG. 1 is a top view of a display panel according to some embodiments of the present disclosure.

In the embodiments of the present disclosure, a display panel 10 is provided. As shown in FIG. 1, the display panel 10 includes: a display region AA (also referred to as an active region or an effective display region, a region AA for short) and a peripheral region BB located on at least one side of the AA region.

In the above display panel 10, a plurality of pixels P' and a plurality of signal lines are provided in the display region AA, and the plurality of signal lines are electrically coupled to the plurality of pixels P'. Exemplarily, each of the plurality of pixels includes sub-pixels P of at least three colors. The sub-pixels P of the at least three colors at least include a first color sub-pixel, a second color sub-pixel, and a third color sub-pixel. The first color, the second color and the third color are the three primary colors (e.g., red color, green color and blue color).

Figure 2:
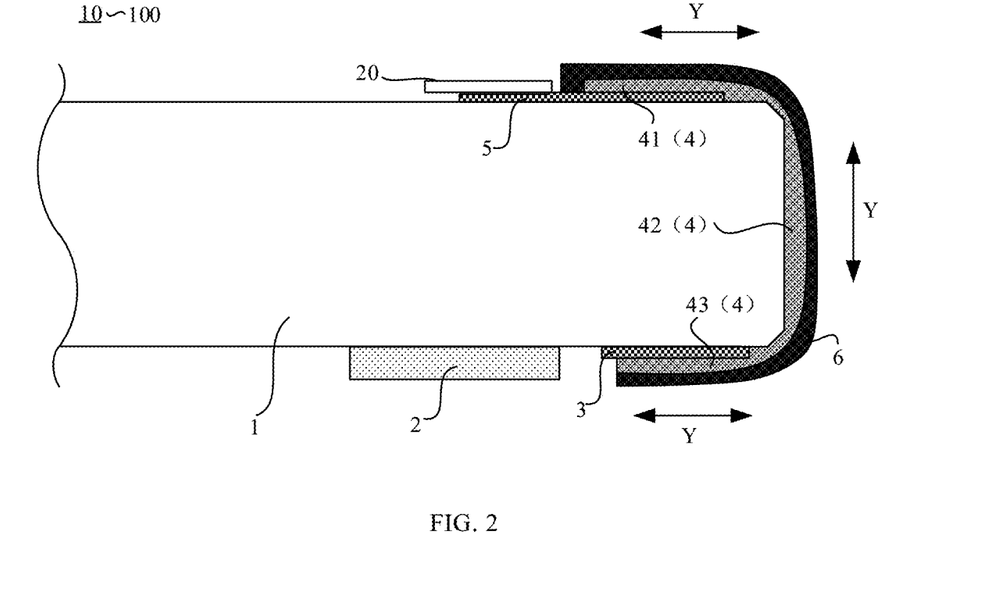
FIG. 2 is a cross-sectional view of a display panel taken along a line CC' in FIG. 1.
Figure 5:
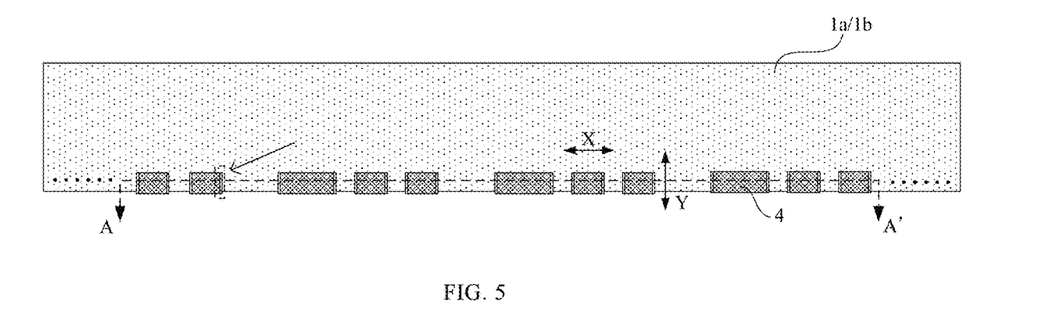
FIG. 5 is a partial top view of a display panel according to some embodiments of the present disclosure.

As shown in FIG. 1, FIG. 2 and FIG. 5, in some embodiments, the display panel 10 includes a back plate 1, a plurality of light emitting devices 2 and at least one connection lead 4.

Figure 3:
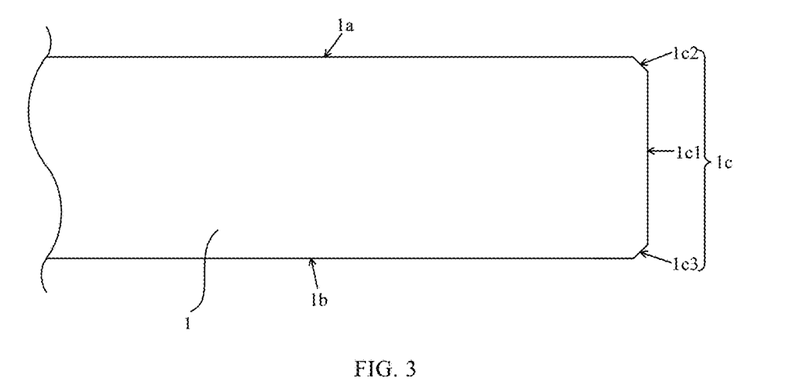
FIG. 3 is a cross-sectional view of a back plate of a display panel according to some embodiments of the present disclosure.

Referring to FIG. 3, the back plate 1 includes a first main surface 1a and a second main surface 1b opposite to each other, and at least one side surface 1c connecting between the first main surface 1a and the second main surface 1b. At least one of the at least one side surface 1c is a selected side surface 1cc. As shown in FIG. 1, each of the first main surface 1a and the second main surface 1b of the back plate 1 has a shape of, for example, a rectangle, and the back plate 1 includes four side surfaces 1c.

Figure 4:
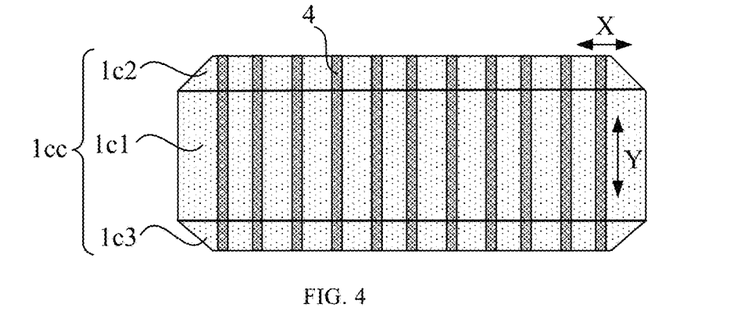
FIG. 4 is a schematic diagram illustrating a plurality of connection leads on a selected side surface of a display panel according to some embodiments of the present disclosure.

As shown in FIG. 3 and FIG. 4, in some embodiments, the selected side surface 1cc includes a side sub-surface 1c1 which is perpendicular or substantially perpendicular to the first and second main surfaces 1a and 1b, a first transition sub-surface 1c2 connecting between the first main surface 1a and the side sub-surface 1c1, and a second transition sub-surface 1c3 connecting between the second main surface 1b and the side sub-surface 1c1.

Exemplarily, the back plate 1 includes a base substrate and driving circuits on a side of the base substrate. A material of the base substrate may be a rigid material selected from glass, quartz, plastic, and the like. Each of the driving circuits includes, for example, thin film transistors (TFTs) and the above plurality of signal lines. The driving circuits are coupled to the plurality of light emitting devices 2 and configured to drive the plurality of light emitting devices 2 to emit light, respectively.

Figure 6:
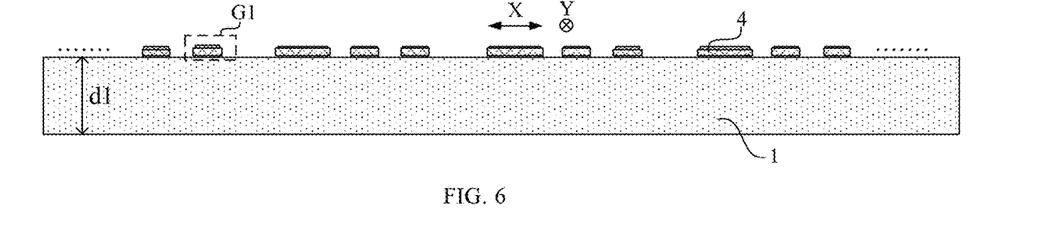
FIG. 6 is a cross-sectional view of a display panel taken along a line AA' in FIG. 5.

Exemplarily, as shown in FIG. 6, the back plate 1 has a thickness d1 in a range from 0.5 mm to 1 mm in a direction perpendicular to the base substrate, for example, the thickness d1 of the back plate 1 may be 0.5 mm, 0.7 mm, or 1 mm.

As shown in FIG. 1 and FIG. 2, the plurality of light emitting devices 2 are provided on the second main surface 1b of the back plate 1. The light emitting device 2 includes, but is not limited to, an organic light emitting diode (OLED for short), a mini light emitting diode (mini LED for short), a micro light emitting diode (micro LED for short), and the like. Exemplarily, each of the sub-pixels P includes at least one light emitting device 2.

The at least one connection lead 4 is provided on the selected side surface 1cc, extends and reaches to the first main surface 1a and the second main surface 1b, and is connected to a corresponding one of the plurality of light emitting devices 2, respectively. That is, the at least one connection lead 4 is provided on the first main surface 1a, on the selected side surface 1cc and on the second main surface 1b. The at least one connection lead 4 may include a plurality of connection leads 4, and each of the plurality of connection leads 4 extends sequentially across the first main surface 1a, the selected side surface 1cc and the second main surface 1b. Each of the plurality of connection leads includes a first portion 41 located on the first main surface 1a, a second portion 42 located on the selected side surface 1cc, and a third portion 43 located on the second main surface 1b. Each of the plurality of connection leads 4 includes at least a main conductive layer 4c.

The connection lead 4 is configured to connect a device on the first main surface 1a of the back plate with a device on the second main surface 1b of the back plate. Exemplarily, the plurality of light emitting devices 2 are electrically coupled to a driving chip 20 on the back surface of the display panel 10 through the plurality of connection leads 4, so that the driving chip 20 may control the plurality of light emitting devices 2 to emit light.

As shown in FIG. 4, in some embodiments, the plurality of connection leads 4 are arranged in parallel and at an equal interval, and each of the plurality of connection leads 4 extends in its length direction Y.

Figure 7:
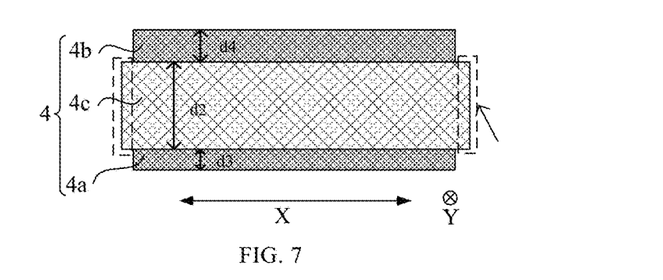
FIG. 7 is a zoom-in view of a region G1 in FIG. 6.

In some embodiments, as shown in FIG. 6 and FIG. 7, FIG. 6 is a cross-sectional view of the display panel 10 in a partial region taken along a sectional line AA' in FIG. 5, and FIG. 7 is a zoom-in view of an region G1 in FIG. 6. Each of the at least one connection lead 4 is of a laminated (or stacked) structure including a main conductive layer 4c, a first buffer conductive layer 4a, and a second buffer conductive layer 4b. The first buffer conductive layer 4a, the main conductive layer 4c, and the second buffer conductive layer 4b are sequentially stacked on the back plate 1, and the first buffer conductive layer 4a is closer to the back plate 1 with respect to the main conductive layer 4c. The adhesiveness between the first buffer conductive layer 4a and the back plate 1 is greater than that between the main conductive layer 4c and the back plate 1; and the oxidation resistance of the second buffer conductive layer 4b is superior to that of the main conductive layer 4c.

The first buffer conductive layer 4a, the main conductive layer 4c and the second buffer conductive layer 4b each are conductive. The main conductive layer 4c has a strong conductive performance and a low resistivity, and a material of the main conductive layer 4c includes, for example, copper (Cu). On the basis that the connection lead 4 is ensured to have a strong conductive performance and a low signal loss to realize stable transmission of signals, the first buffer conductive layer 4a and the second buffer conductive layer 4b are provided on two sides, in a direction perpendicular to the surface on which the main conductive layer 4c is located, of the main conductive layer 4c of the connection lead 4, respectively. The first buffer conductive layer 4a enhances the adhesiveness between the plurality of connection leads 4 and the back plate 1, so that the plurality of connection leads 4 are not prone to fall off, and the second buffer conductive layer 4b may protect the main conductive layer 4c, so that the oxidation resistance of the plurality of connection leads 4 is enhanced, and the plurality of connection leads 4 are not prone to be corroded by water and oxygen and have prolonged service life.

In some embodiments, a material of the first buffer conductive layer 4a is selected from materials having strong adhesiveness, for example, materials having strong bonding force with glass. A material of the second buffer conductive layer 4b is selected from materials having strong oxidation resistance. Exemplarily, the material of the first buffer conductive layer 4a is the same as the material of the second buffer conductive layer 4b, and a material of the first and second buffer conductive layers 4a and 4b includes at least one of titanium (Ti), chromium (Ge), molybdenum (Mo), or molybdenum-niobium alloy (MoNb). For example, the material of the first and second buffer conductive layers 4a and 4b is Ti, Ge, Mo, Monb, a mixed material of Ti and Ge, or a mixed material of Ti, Ge, and Mo, and the like.

In some embodiments, as shown in FIG. 7, the main conductive layer 4c may have a thickness d2 in a range from 0.4 μm to 1 μm in a direction perpendicular to a surface on which the main conductive layer 4c is located, for example, the thickness d2 of the main conductive layer 4c may be 0.4 μm, 0.6 μm, or 1 μm. The first buffer conductive layer 4a may have a thickness d3 in a range from 30 nm to 70 nm in a direction perpendicular to a surface on which the first buffer conductive layer 4a is located, for example, the thickness d3 of the first buffer conductive layer 4a may be 30 nm, 50 nm, or 70 nm. The second buffer conductive layer 4b may have a thickness d4 in a range from 50 nm to 120 nm in a direction perpendicular to a surface on which the second buffer conductive layer 4b is located, for example, the thickness d4 of the second buffer conductive layer 4b may be 50 nm, 80 nm, or 120 nm.

In some embodiments, the connection lead 4 may be formed as follows. Metal layers are formed on the first main surface 1a, on the selected side surface 1cc and on the second main surface 1b of the back plate 1 by depositing metal materials, thereby sequentially forming a first buffer conductive material layer, a main conductive material layer and a second buffer conductive material layer. Then, the respective conductive material layers are patterned by an etching process to form the plurality of connection leads 4. The etching process may include, for example, a wet etching or a laser etching.

Thus, as shown in FIG. 6 and FIG. 7, after the etching process is completed, a case that the main conductive layer 4c is exposed from the two sides of the connection lead 4 in a width direction X (as illustrated in the dotted-line of FIG. 6 and FIG. 7) may occur. Since each of the thickness of the first buffer conductive layer 4a and the thickness of the second buffer conductive layer 4b is much smaller than that of the main conductive layer 4c, when the etching process is used to perform the pattern process on the laminated structure of the first buffer conductive material layer, the main conductive material layer, and the second buffer conductive material layer, the resulted first buffer conductive layer 4a and the resulted second buffer conductive layer 4b of the connection lead 4 each may be over-etched, and the resulted second buffer conductive layer 4b may be over-etched more severely. Meanwhile, the main conductive layer has a larger thickness, so that the resulted main conductive layer on the two sides of the connection lead 4 in the width direction X may have a larger exposed surface, and the main conductive layer 4c may be exposed more, for example, the exposed surface of the main conductive layer 4c as illustrated in the dotted-line indicated by an arrow in FIG. 6 and FIG. 7. The exposed main conductive layer 4c is not protected by the second buffer conductive layer 4b, and may be gradually corroded and turn black under the condition of long time contact with water and oxygen. The corroded part gradually permeates inwards from the exposed surface, resulting in increasing resistance of the side surface connection lead and even a broken connection lead.

It should be noted that, a width direction X of the connection lead 4 is perpendicular to its length direction (i.e., its extension direction) Y, that is, a width direction X of the connection lead 4 is perpendicular to an extension direction of the connection lead 4. The width direction X of a part on the selected side surface 1cc of the connection lead 4 is perpendicular to the length direction Y of the part. The width direction X of a part on the first main surface 1a and on the second main surface 1b of the connection lead 4 is perpendicular to the length direction Y of the part.

Figure 8:
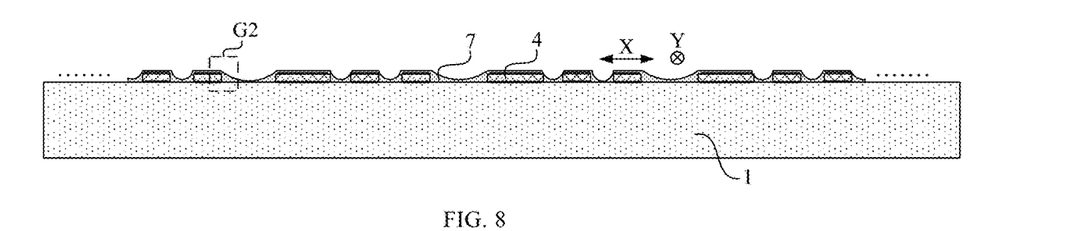
FIG. 8 is a cross-sectional view of a display panel taken along a line AA' in FIG. 5 according to some embodiments of the present disclosure.
Figure 9:
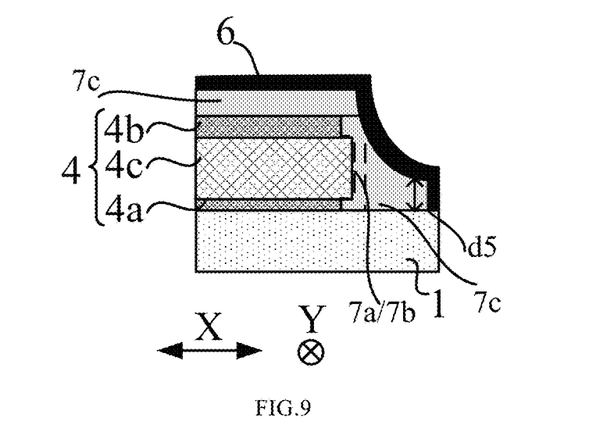
FIG. 9 is a zoom-in view of a region G2 in FIG. 8.

Based on the above, as shown in FIG. 8 to FIG. 11B, the display panel 10 provided by the present disclosure further includes a first protection layer 7. The first protection layer 7 at least includes a portion on the two sides of the main conductive layer 4c of the connection lead 4 in the width direction X of the connection lead 4, so as to isolate the main conductive layer 4c from the outside. Specifically, the first protection layer 7 at least includes a first portion 7a on the two sides of the main conductive layer 4c of a part on the selected side surface 1cc of the connection lead in the width direction X of the connection lead 4. FIG. 9 shows a zoom-in view of a region G2 of the display panel in FIG. 8. Optionally, as shown in FIG. 9, the first protection layer 7 further includes a second portion 7b and a third portion 7c. The second portion 7b is located on the two sides of the main conductive layers 4c of a part on the first and second main surfaces 1a and 1b of the connection lead 4 in the width direction X of the connection lead 4. The third portion 7c is located in the gap between the parts on the first main surface 1a, on the selected side surface 1cc, and on the second main surface 1b, of every two adjacent connection leads, and is located on a side of the connection lead 4 away from the surface on which the connection lead 4 is located. That is, the third portion 7c may cover the connection lead 4 and the exposed first main surface 1a, the exposed selected side surface 1cc and the exposed second main surface 1b. FIG. 6 is a cross-sectional view of the display panel taken along a line AA' in FIG. 5, showing a cross section of a part on the first main surface 1a of the connection lead. The cross section perpendicular to the extending direction of the parts, on the selected side surface 1cc and on the second main surface 1b, of the connection lead, is the same as the cross section perpendicular to the extending direction of the parts, on the first main surface 1a, of the corresponding connection lead, and thus the cross section of the parts on the first main surface 1a of the connection lead in FIG. 6 will be taken as an example for explanation.

By providing the first protection layer 7 at least on the two sides of the main conductive layer 4c of the connection lead 4 in its width direction X, the main conductive layer 4c exposed from the etched interface of the connection lead 4 can be protected, so that the main conductive layer 4c cannot be corroded by external water and oxygen, the oxidation rate of the main conductive layer 4c can be reduced, the connection stability of the connection lead 4 can be enhanced, and the service life of the display panel 10 can be prolonged.

The first protection layer 7 may be made of a material having high oxidation resistance, which may block external water and oxygen and prevent corrosion to the main conductive layer 4c.

In some embodiments, as shown in FIG. 8 and FIG. 9, the material of the first protection layer 7 may include silicon nitride. The first protection layer 7 is a silicon nitride layer.

In some embodiments, the first protection layer 7 further includes a third portion 7c, which is in the gap between the parts, on the first main surface 1a, on the selected side surface 1cc and on the second main surface 1b, of every two adjacent connection leads 4 (i.e., in the regions of the first main surface 1a, the selected side surface 1cc and the second main surface 1b except the regions where the connecting lead 4 and other circuit elements are located) and is on a side of the connection lead 4 away from the surface on which the p connection lead 4 are located. That is, the first protection layer 7 covers the connection lead 4, a part of the first main surface 1a, a part of the selected side surface 1cc and a part of the second main surface 1b. Further, as shown in FIG. 9, the first portion 7a, the second portion 7b, and the third portion 7c may be formed as a single piece to better cover the connection lead beneath the third portion 7c.

That is, in a case where the material of the first protection layer 7 includes silicon nitride, the first protection layer 7 may include only the first portion and the second portion on the two sides of the main conductive layer 4c of the connection lead 4 in the width direction X of the connection lead, i.e., the first protection layer 7 covers only the exposed interface of the main conductive layer 4c of the connection lead 4 to protect the exposed interface of the main conductive layer 4c of the connection lead 4 at fixed points. The first protection layer 7 may further cover the connection lead 4, and the exposed first main surface 1a, the exposed selected side surface 1cc and the exposed second main surface 1b to further enhance the protection on the connection lead 4.

Exemplarily, a silicon nitride film material is deposited on a side of the plurality of connection leads 4 away from the back plate 1 by a sputtering process, and a silicon nitride film is formed on the side of the plurality of connection leads 4 away from the back plate 1 and in the gap between every two adjacent connection leads 4 on the surface of the back plate 1, thereby forming a continuous first protection layer 7. This design not only enables the first protection layer 7 to better cover the main conductive layer 4c exposed from the two sides of the connection lead 4 in the width direction X, but also enhances the bondability between the first protection layer 7 and the second buffer conductive layers 4b, thereby better protecting the exposed main conductive layer 4c.

In some embodiments, as shown in FIG. 9, the third portion 7c of the first protection layer 7 on the first main surface 1a, on the selected side surface 1cc, and on the second main surface 1b has a thickness d5 in a range from 0.2 μm to 0.5 μm in a direction perpendicular to the surface on which the third portion 7c is located. Exemplarily, the thickness d5 may be 0.2 μm, 0.3 μm, or 0.5 μm. Thus, the first protection layer 7 can be ensured to cover the main conductive layer 4c exposed from the two sides in the width direction X of the connection lead 4, and the silicon nitride layer can be prevented from falling off, thereby enhancing the bondability.

A thickness of the first protection layer 7 in the gap between the parts on the first main surface 1a and on the second main surface 1b of every two adjacent connection leads 4 refers to a thickness of the first protection layer 7 in a direction perpendicular to the plane on which the back plate 1 is located, and a thickness of the first protection layer 7 in the gap between the parts on the selected side surface 1cc of every two adjacent connection leads 4 refers to a thickness of the first protection layer 7 in a direction parallel to the plane on which the back plate 1 is located.

Figure 10:
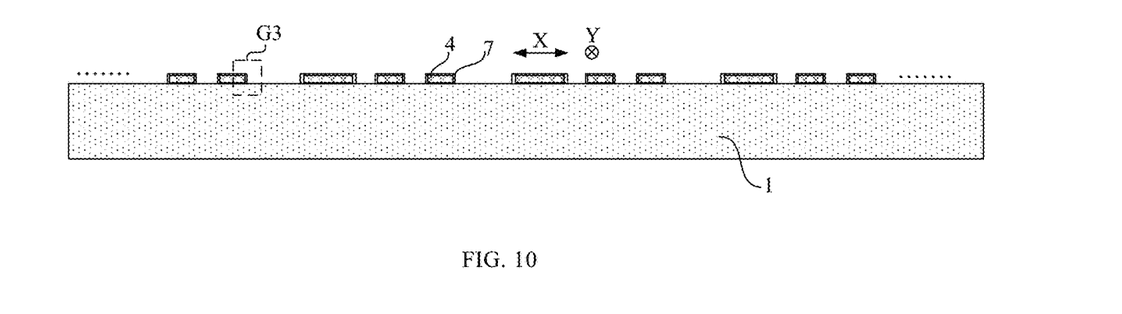
FIG. 10 is a cross-sectional view of a display panel taken along a line AA' in FIG. 5 according to some embodiments of the present disclosure.
Figure 11A:
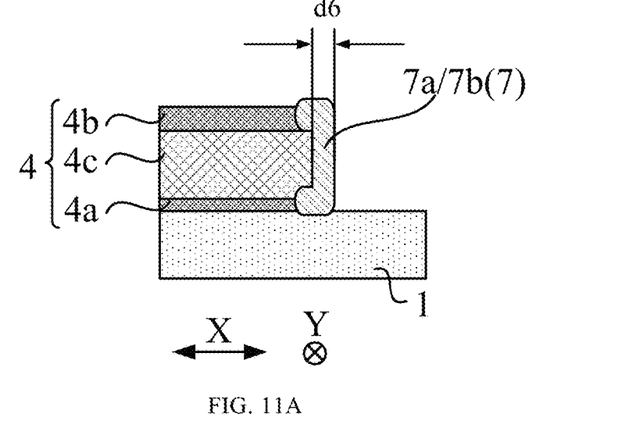
FIG. 11A is a zoom-in view of a region G3 in FIG. 10 according to some embodiments of the present disclosure.
Figure 11B:
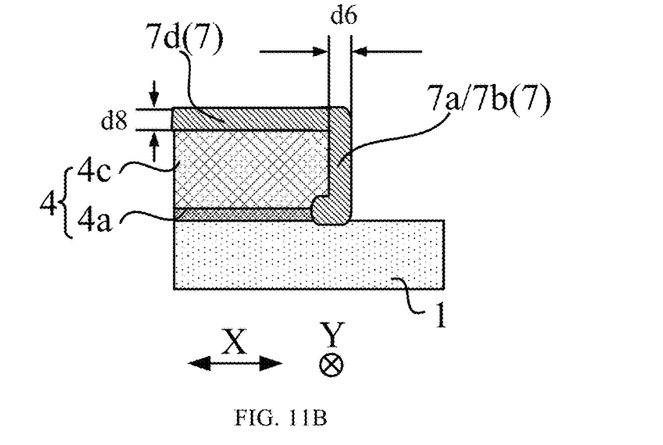
FIG. 11B is a zoom-in view of a region G3 in FIG. 10 according to some embodiments of the present disclosure.

In other embodiments, as shown in FIG. 10, FIG. 11A and FIG. 11B, a material of the first protection layer 7 includes nickel-phosphorus alloy and gold. Exemplarily, the first protection layer 7 includes a nickel-phosphorus alloy layer and a gold layer stacked to each other, and the nickel-phosphorus alloy layer is closer to the main conductive layer 4c with respect to the gold layer.

Exemplarily, by adopting an electroless nickel/immersion gold process, a nickel-phosphorus alloy layer is formed on the exposed surface of the main conductive layer 4c of the connection lead 4, and then a gold layer is formed on the surface of the nickel-phosphorus alloy layer, so as to perform fixed-point protection on the two sides of the main conductive layer 4c of the connection lead 4 in the width direction X of the connection lead 4. The first protection layer 7 may include only the first portion 7 (on the two sides of the part on the selected side surface 1cc of the connection lead in the width direction X of the connection lead 4) and/or the second portion 7b (on the two sides of the part on the first main surface 1a and on the second main surface 1b of the connection lead in the width direction X of the connection lead 4) on the two sides of the main conductive layer 4c of the connection lead in the width direction X of the connection lead 4.

In some examples, as shown in FIG. 11A, a thickness d6 of the first protection layer 7 may be in a range from 1 μm to 1.6 μm in the width direction X of the connection lead 4. For example, the thickness d6 of the first protection layer 7 may be 1 μm, 1.2 μm, or 1.6 μm.

Figure 12:
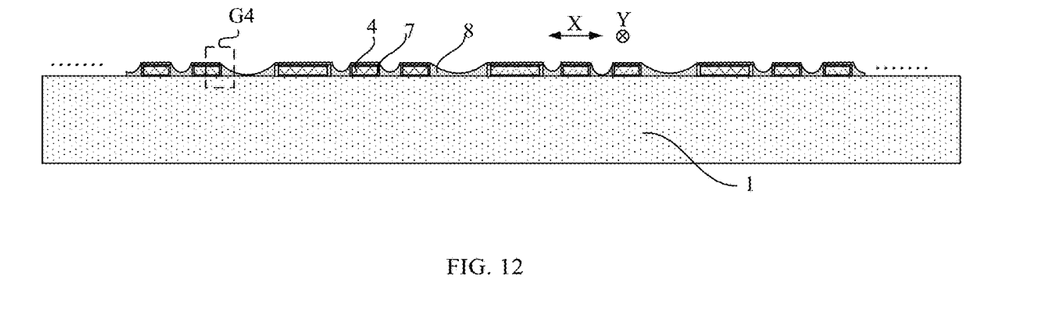
FIG. 12 is a cross-sectional view of a display panel taken along a line AA' in FIG. 5 according to some embodiments of the present disclosure.
Figure 13A:
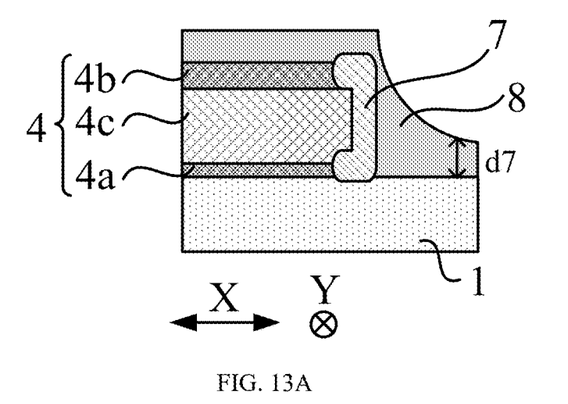
FIG. 13A is a zoom-in view of a region G4 in FIG. 12 according to some embodiments of the present disclosure.

In some embodiments, as shown in FIG. 12 and FIG. 13A, the display panel 10 further includes: a second protection layer 8. The second protection layer 8 covers at least the plurality of connection leads 4, and the first protection layer 7. Optionally, the second protection layer 8 may cover the plurality of connection leads 4, the first protection layer 7, a part of the first main surface 1a, a part of the selected side surface 1cc, and a part of the second main surface 1b (i.e., the parts in the gap between every two adjacent connection leads 4).

Exemplarily, a material of the second protection layer 8 includes silicon nitride. As shown in FIG. 12 and FIG. 13A, on the basis that the display panel 10 includes the first protection layer 7 on the two sides of the main conductive layer 4c of the connection lead 4 in the width direction X of the connection lead 4, the display panel 10 further includes a second protection layer 8 covering the plurality of connection leads 4, the first protection layer 7, a part of the first main surface 1a, a part of the selected side surface 1cc, and a part of the second main surface 1b. The second protection layer 8 is made of a silicon nitride film material, and a thickness d7 of the second protection layer 8 on the first main surface 1a, on the selected side surface 1cc, and on the second main surface 1b is in a range from 0.2 μm to 0.5 μm, for example, 0.2 μm, 0.3 μm, or 0.5 μm, so as to better cover the plurality of connection leads 4 and the first protection layer 7.

Thus, on the basis that the exposed main conductive layer 4c of the connection lead 4 is protected by electroless nickel/immersion gold, the second protection layer 8 made of the silicon nitride film material is provided to further enhance the oxidation resistance and to reduce the damage to the plurality of connection leads 4 caused by collision.

Figure 13B:
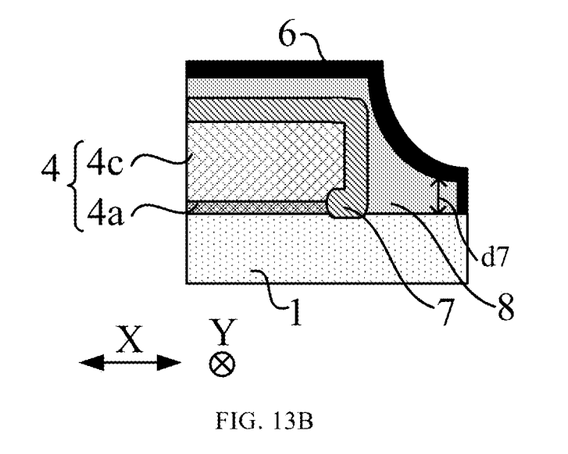
FIG. 13B is a zoom-in view of a region G4 in FIG. 12 according to some embodiments of the present disclosure.

In some embodiments, in a case where a thickness of the main conductive layer 4c of the connection lead 4 in a direction perpendicular to the surface on which the main conductive layer 4c is located is greater than or equal to 0.6 µm, the connection lead 4 may not include the second buffer conductive layer 4b. As shown in FIG. 11B, an upper surface of the main conductive layer 4c of the connection lead 4 away from the back plate 1 and both the two sides of the main conductive layer 4c of the connection lead 4 are exposed, the first protection layer 7 is provided on a side of the main conductive layer 4c of the connection lead 4 away from the back plate 1 and also on the two sides of the main conductive layer 4c of the connection lead 4. A material of the first protection layer 7 includes nickel-phosphorus alloy and gold. That is, in a case where the connection lead 4 does not include the second buffer conductive layer 4b, the main conductive layer 4c is directly protected by electroless nickel/immersion gold. That is, the first protection layer 7 further includes a fifth portion 7d on a side of the connection lead 4 away from the surface on which the connection lead 4 is located. A thickness d8 of the fifth portion 7d in a direction perpendicular to the surface on which the fifth portion 7d is located is in a range from 1 µm to 1.6 µm, for example, the thickness d8 of the fifth portion of the first protection layer 7 may be 1 µm, 1.2 µm, or 1.6 µm. Accordingly, as shown in FIG. 13B, the second protection layer 8 further covers the first protection layer 7 on a side of the main conductive layer 4c of the connection lead 4 away from the back plate 1 and on both the two sides of the main conductive layer 4c. Optionally, the first portion 7a, the second portion 7b and the fifth portion 7d of the first protection layer 7 of a same connection lead may be formed as a single piece.

In some embodiments, as shown in FIG. 1 and FIG. 2, the display panel 10 further includes a plurality of first electrodes 3 on the second main surface 1b of the back plate 1. The plurality of first electrodes 3 are closer to the selected side surface 1cc with respect to the plurality of light emitting devices 2. The plurality of first electrodes 3 are electrically coupled to the plurality of light emitting devices 2 (not shown), respectively. One first electrode 3 is electrically coupled to one connection lead 4. Exemplarily, the plurality of light emitting devices 2 are provided in the display region AA of the display panel 10, and the plurality of first electrodes 3 are provided in the peripheral region BB of the display panel 10. The plurality of first electrodes 3 are electrically coupled to the plurality of light emitting devices 2 through the driving circuits, respectively.

In some embodiments, as shown in FIG. 1 and FIG. 2, the connection lead 4 is electrically coupled to a corresponding first electrode 3 as follows: an orthogonal projection of a part on the second main surface 1b of the connection lead 4 at least overlaps with an orthogonal projection of the first electrode 3 electrically coupled to the connection lead 4 on the second main surface 1b. That is, the connection lead 4 is directly electrically coupled to the first electrode 3 by being in contact with and covering a part of the corresponding first electrode 3 or through a via. Therefore, the connection lead 4 has a larger contact area with the corresponding first electrode 3, so that the connection lead 4 may be in full contact with the corresponding first electrode 3 to facilitate signal transmission.

Thus, as shown in FIG. 8 and FIG. 9, in a case where a material of the first protection layer 7 includes silicon nitride and the first protection layer 7 includes only the portions on the two sides of the main conductive layer 4c of the connection lead 4 in the width direction X of the connection lead 4, or as shown in FIG. 10 to FIG. 13A, in a case where a material of the first protection layer 7 includes nickel-phosphorus alloy and gold, an orthographic projection on the second main surface 1b of the portion on the second main surface 1b of the first protection layer 7 corresponding to the connection lead 4 at least partially overlaps with an orthographic projection on the second main surface 1b of the corresponding first electrode 3 electrically coupled to the connection lead 4.

As shown in FIG. 8 and FIG. 9, in a case where a material of the first protection layer 7 includes silicon nitride and the first protection layer 7 includes a portion on both the two sides of the main conductive layer 4c of the connection lead 4 in the width direction X of the connection lead 4, a portion on a side of the plurality of connection leads 4 away from the back plate 1, and a portion in the gap between the parts on the first main surface 1a, on the selected side surface 1cc, and on the second main surface 1b, of every two adjacent connection leads 4 (i.e., in a case where the first protection layer 7 is of a structure covering throughout the back plate 1), the first protection layer 7 further covers at least parts of the plurality of first electrodes 3 which overlap with the plurality of connection leads 4. Also, as shown in FIG. 12 and FIG. 13A, the second protection layer 8 further covers at least the parts of the plurality of first electrodes 3 which overlap with the plurality of connection leads 4.

In other embodiments, the portion of the connection lead 4 extending onto the second main surface 1b is directly electrically coupled to the corresponding first electrode 3 by surface contact with an end, close to the selected side surface 1cc, of the corresponding first electrode 3. The connection lead 4 does not overlap with the corresponding first electrode 3. Thus, neither the first protection layer 7 nor the second protection layer 8 may overlap with the first electrode 3.

In other embodiments, as shown in FIG. 2, the display panel 10 further includes a plurality of second electrodes 5 on the first main surface 1a. The plurality of second electrodes 5 are configured to be electrically coupled to a driving chip or a flexible wiring board. One connection lead 4 is electrically coupled to one of the plurality of second electrodes 5.

The number of the plurality of second electrodes 5 is the same as the number of the plurality of connection leads 4. One end of the connection lead 4 is electrically coupled to one first electrode 3, and the other end of the connection lead 4 is electrically coupled to one second electrode 5. The plurality of first electrodes 3 and the plurality of second electrodes 5 may be communicated in a one-to-one correspondence through the plurality of connection leads 4 to implement signal transmission, respectively.

In some embodiments, as shown in FIG. 2, the connection lead 4 is electrically coupled to a corresponding second electrode 5 as follows: an orthogonal projection of a portion on the first main surface 1a of the connection lead 4 on the first main surface 1a at least partially overlaps with an orthogonal projection of the corresponding second electrode 5 electrically coupled to the connection lead 4 on the first main surface 1a. That is, the connection lead 4 is directly electrically coupled to the corresponding second electrode 5 by being in contact with and covering a part of the corresponding second electrode 5 corresponding to the connection lead 4 or through a via. Therefore, the connection lead 4 has a larger contact area with the corresponding second electrode 5, so that the connection lead 4 may be in full contact with the corresponding second electrode 5 to facilitate signal transmission.

Thus, as shown in FIG. 8 and FIG. 9, in a case where a material of the first protection layer 7 includes silicon nitride and the first protection layer 7 includes only the portions on the two sides of the main conductive layer 4c of the connection lead 4 in the width direction X of the connection lead 4, or as shown in FIG. 10 to FIG. 13A, in a case where a material of the first protection layer 7 includes nickel-phosphorus alloy and gold, an orthographic projection on the first main surface 1a of the portions on the first main surface 1a of the first protection layer 7 corresponding to the connection lead 4 at least partially overlaps with an orthographic projection on the first main surface 1a of the corresponding second electrode 5 electrically coupled to the connection lead 4.

As shown in FIG. 8 and FIG. 9, in a case where a material of the first protection layer 7 includes silicon nitride and the first protection layer 7 includes a portion on both the two sides of the main conductive layers 4c of the connection lead 4 in the width direction X of the connection lead 4, a portion on a side of the connection lead 4 away from the back plate 1, and a portion in the gap between the parts, on the first main surface 1a, on the selected side surface 1cc, and on the second main surface 1b, of every two adjacent connection leads 4 (i.e., in a case where the first protection layer 7 is of a structure covering throughout the back plate 1), the first protection layer 7 further covers at least parts of the plurality of second electrodes 5 which overlap with the plurality of connection leads 4. Similarly, as shown in FIG. 12 and FIG. 13A, the second protection layer 8 further covers at least the parts of the plurality of second electrodes 5 which overlap with the plurality of connection leads 4.

In other embodiments, the portion of the connection lead 4 extending onto the first main surface 1a is directly electrically coupled to the corresponding second electrode 5 by surface contact with an end, close to the selected side surface 1cc, of the corresponding second electrode 5. The connection lead 4 does not overlap with the corresponding second electrode 5. Thus, neither the first protection layer 7 nor the second protection layer 8 may overlap with the second electrodes 5.

In some embodiments, as shown in FIG. 2, the display panel 10 further includes a protection adhesive layer 6 on a side of the plurality of connection leads 4 away from the back plate 1. Exemplarily, the protective adhesive layer 6 may fill the gap between every two adjacent connection leads 4 and cover the surfaces of the plurality of connection leads 4. The protection adhesive layer 6 may further cover a portion of the surfaces of the first electrodes 3 and the second electrodes 5.

In some embodiments, as shown in FIG. 8 and FIG. 9, in a case where the display panel 10 includes the first protection layer 7 made of silicon nitride, or as shown in FIG. 10 and FIG. 11A, in a case where a material of the first protection layer 7 includes nickel-phosphorus alloy and gold, the protection adhesive layer 6 covers the first protection layer 7. As shown in FIG. 13A and FIG. 13B, in a case where the display panel 10 includes the first protection layer 7 and the second protection layer 8, the protection adhesive layer 6 covers the first protection layer 7 and the second protection layer 8.

The protection adhesive layer 6 is configured to protect the plurality of connection leads 4, and functions as electrical insulation and further prevention from water and oxygen corrosion. In some examples, the protection adhesive layer 6 is made of an insulating material with high corrosion resistance and high adhesion. Exemplarily, the protection adhesive layer 6 is an OC (over coating) adhesive or an ink layer. The protection adhesive layer 6 may be formed by using a method such as a spray coating process, a deposition process, and the like.

In the embodiments of the present disclosure, a display apparatus 100 is further provided. As shown in FIG. 2, the display apparatus 100 includes: a display panel 10 and a driving chip 20.

The driving chip 20 is provided on the first main surface 1a of the back plate 1 of the display panel 10, and the driving chip 20 is electrically coupled to the plurality of light emitting devices 2 of the display panel 10 through the plurality of connection leads 4 of the display panel 10. In some embodiments, as shown in FIG. 2, in a case where the display panel 10 further includes a plurality of first electrodes 3 and a plurality of second electrodes 5, the plurality of first electrodes 3 are respectively electrically coupled to the plurality of connection leads 4, and the plurality of second electrodes 5 are respectively electrically coupled to the plurality of connection leads 4. The driving chip 20 is electrically coupled to the plurality of second electrodes 5, then is electrically coupled to the plurality of first electrodes 3 through the plurality of second electrodes 5 and the plurality of connection leads 4, and is further electrically coupled to the plurality of light emitting devices 2.

In some embodiments, the above display apparatus 100 may be a mini LED display apparatus or a Micro LED display apparatus.

The design that the first protection layer 7 is provided to protect the plurality of connection leads is adopted in the display panel provided by the present disclosure, so that the plurality of connection leads are prevented from being corroded by water and oxygen, the process is simple. Therefore, the production cost and the process risk can be reduced, the service life of the display panel can be prolonged, the service life of the display apparatus can be prolonged, and the reliability of the display apparatus can be enhanced.

Figure 14:
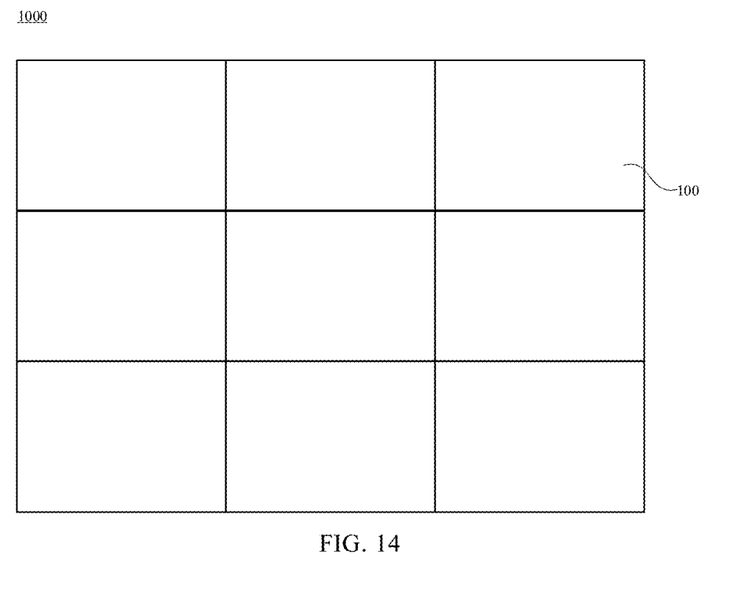
FIG. 14 is a diagram illustrating a structure of a splicing display apparatus according to some embodiments of the present disclosure.

In the embodiments of the present disclosure, a splicing display apparatus 1000 is further provided. As shown in FIG. 14, the splicing display apparatus 1000 includes a plurality of display apparatuses 100 according to the embodiments of the present disclosure, and the plurality of display apparatuses 100 are assembled together by splicing. Since the size of the bezel of each of the plurality of display apparatuses 100 for splicing is small, the splicing seam between two adjacent display apparatuses 100 is difficult to be viewed by naked eyes within a viewing distance when the splicing display apparatus 1000 is actually for displaying, and better display quality can be presented.

Figure 15:
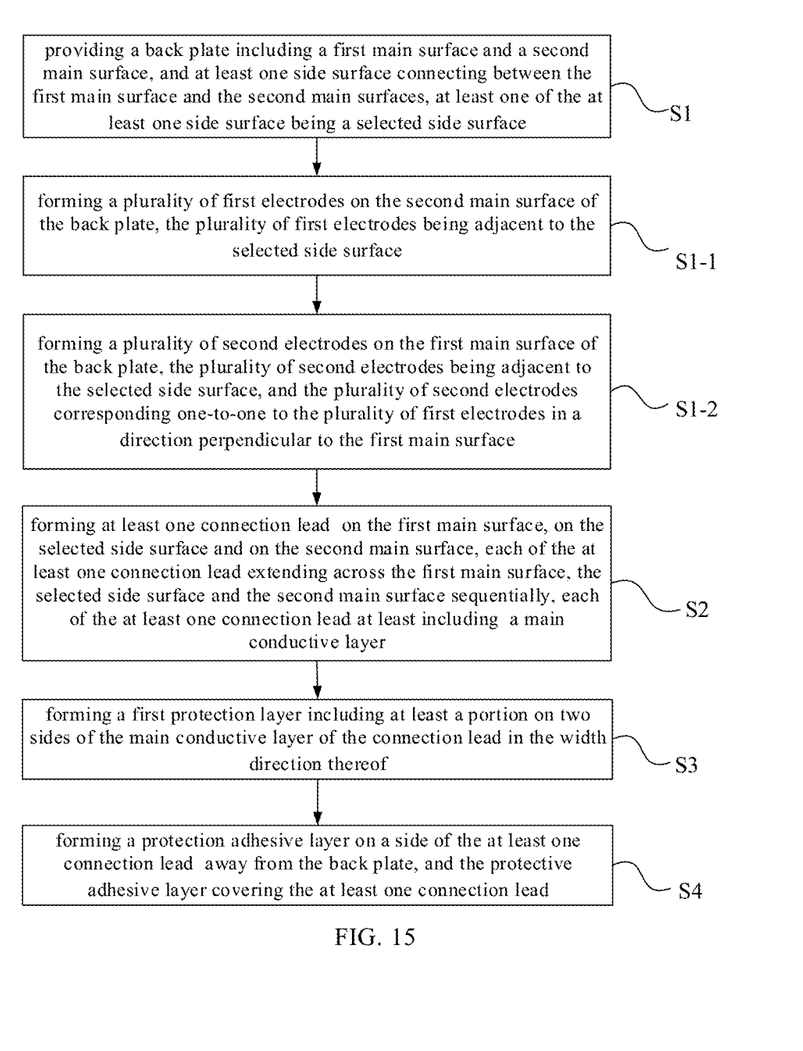
FIG. 15 is a flowchart illustrating a method for manufacturing a display panel according to some embodiments of the present disclosure.

In the embodiments of the present disclosure, a method for manufacturing a display panel is further provided. As shown in FIG. 15, the manufacturing method includes the following steps S1 to S4.

In step S1, a back plate 1 is provided. The back plate 1 includes a first main surface 1a and a second main surface 1b, and at least one side surface 1c connecting between the first main surface 1a and the second main surface 1b. One of the at least one side surface 1c is a selected side surface 1cc.

In step S2, at least one connection lead 4 is formed on the selected side surface 1cc, such that each of the at least one connection lead 4 includes a main conductive layer 4c. The connection lead 4 may further extends and reaches to the first main surface 1a and the second main surface 1b, and is electrically coupled to a corresponding one of a plurality of light emitting devices. The plurality of light emitting devices are located on the second main surface 1b.

Exemplarily, in step S2, the forming the at least one connection lead 4 on the first main surface 1a, on the selected side surface 1cc and on the second main surface 1b includes the following steps S21 to S22.

In step S21, metal layers are formed on the first main surface 1a, on the selected side surface 1cc, and on the second main surface 1b of the back plate.

Exemplarily, metal materials may be deposited by an electroplating process, an evaporation process, a pad-printing silver paste, a sputtering process (e.g., a multi-arc magnetron sputtering process), or the like, to form the metal layers on the first main surface 1a, on the selected side surfaces 1cc and on the second main surface 1b of the back plate 1.

In some embodiments, the above metal layers may include a first buffer conductive material layer, a main conductive material layer, and a second buffer conductive material layer. The first buffer conductive material layer, the main conductive material layer and the second buffer conductive material layer are sequentially formed by adopting the above processes, thereby forming a laminated metal layer of three layers; or, the first buffer conductive material layer and the main conductive material layer are sequentially formed by adopting the above processes, thereby forming a laminated metal layer of two layers. The first buffer conductive material layer is closer to the back plate 1 with respect to the main conductive material layer. Exemplarily, a thickness of the first buffer conductive material layer is in a range from 30 nm to 70 nm, a thickness of the second buffer conductive material layer is in a range from 50 nm to 120 nm, and a thickness of the main conductive material layer is in a range from 0.4 µm to 1 µm.

Exemplarily, a material of the first buffer conductive material layer may be the same as a material of the second buffer conductive material layer, and the material of the first buffer conductive material layer and the second buffer conductive material layer may include at least one of Ti, Ge, Mo, or Monb. A material of the main conductive material layer has strong conductive performance, for example, the material of the main conductive material layer includes Cu.

In step S22, the metal layers are patterned, resulting in a plurality of connection leads 4. Each of the plurality of connection leads 4 extends across the first main surface 1a, the selected side surface 1cc and the second main surface 1b sequentially.

In some embodiments, the metal layers are patterned by using a laser etching process with high process accuracy, resulting in a plurality of connection leads 4. Thus, in a case where the connection lead 4 includes the first buffer conductive layer 4a, the main conductive layer 4c, and the second buffer conductive layer 4c, which are sequentially stacked on the back plate, the main conductive layer 4c of the connection lead 4 is exposed from the etched interface.

In step S3, a first protection layer 7 is formed. The first protection layer 7 at least includes a portion on two sides of the main conductive layer 4c of the connection lead in the width direction X of the connection lead. Optionally, the first protection layer 7 at least includes a first portion on the two sides of the main conductive layer 4c of a part on the selected side surface 1cc of each of the connection lead in the width direction X of the connection lead. Optionally, the first protection layer 7 further includes a second portion on the two sides of the main conductive layer of a part on the first and second main surfaces 1a and 1b of the connection lead in the width direction X of the connection lead; and a third portion which is in a gap between the parts, on the first main surface 1a, on the selected side surface 1c, and on the second main surface 1b, of every two adjacent connection leads of the plurality of connection leads, and is on a side of the plurality of connection leads away from the back plate.

In some embodiments, in step S3, the forming the first protection layer 7 includes the following steps. In step S31, a silicon nitride material is sputtered on a side of the plurality of connection leads 4 away from the back plate 1 to form the first protection layer 7. The first protection layer 7 covers the plurality of connection leads 4, a part of the first main surface 1a, a part of the selected side surface 1cc and a part of the second main surface 1b.

Exemplarily, a material of the first protection layer 7 is silicon nitride. A silicon nitride film material is deposited on a side of the plurality of connection leads 4 away from the back plate 1 by a sputtering process. A silicon nitride film layer is formed on a side of the plurality of connection leads 4 away from the back plate 1, in the gap between every two adjacent connection leads 4 on the surface of the back plate 1, thereby forming the first protection layer 7 as a continuous single surface covering the plurality of connection leads 4, a part of the first main surface 1a, a part of the selected side surface 1cc and a part of the second main surface 1b.

In some embodiments, the first protection layer 7 has a thickness in a range from 0.2 µm to 0.5 µm on the first main surface 1a, on the selected side surface 1c, and on the second main surface 1b.

In other embodiments, in step S3, the forming the first protection layer 7 includes the following steps. In step S31', the first protection layer 7 is formed on the two sides of the main conductive layer 4c of the connection lead 4 in the width direction X of the connection lead 4 by an electroless nickel/immersion gold process. A material of the first protection layer 7 includes nickel-phosphorus alloy and gold.

The electroless nickel/immersion gold is prepared by replacing palladium on the surface of copper through chemical reaction, then plating a nickel-phosphorus alloy layer on the palladium core, and then plating a gold layer on the surface of nickel through replacement reaction. That is, the first protection layer 7 includes a nickel-phosphorus alloy layer on the exposed interface of the main conductive layer 4c, and a gold layer on a side of the nickel-phosphorus alloy layer away from the connection lead 4.

The electroless nickel/immersion gold process includes the steps of oil removing, micro-etching, front soaking, activation, back soaking, electroless nickel and immersion gold. The first protection layer 7 formed by the electroless nickel/immersion gold process can protect the exposed main conductive layer 4c of the connection lead 4 at fixed points, that is, the first protection layer 7 only protect the exposed copper section, so that water and oxygen are blocked more effectively.

Exemplarily, as shown in FIG. 10 and FIG. 11A, a thickness d6 of the first protection layer 7 is in a range from 1 µm to 1.6 µm in the width direction X of the connection lead 4.

In some embodiments, in the step S31', in a case where the first protection layer 7 is formed on the two sides of the main conductive layer 4c of the connection lead 4 in the width direction X of the connection lead 4 by using an electroless nickel/immersion gold process, as shown in FIG. 12 and FIG. 13A, the manufacturing method for the display panel further includes forming a second protection layer 8 in the step S32' after S31'. The second protection layer 8 covers the plurality of connection leads 4, the first protection layer 7, a part of the first main surface, a part of the selected side surface, and a part of the second main surface.

Exemplarily, a material of the second protection layer 8 includes silicon nitride. A silicon nitride film material is deposited on a side of the plurality of connection leads 4 away from the back plate 1 by a sputtering process. A silicon nitride film layer is formed on a side of the plurality of connection leads 4 away from the back plate 1, in the gap between every two adjacent connection leads 4 on the surface of the back plate 1, thereby forming a second protection layer 8 as a continuous single surface covering the plurality of connection leads 4, the first protection layer 7, a part of the first main surface 1a, a part of the selected side surface 1cc and a part of the second main surface 1b.

With the combined action of the nickel-phosphorus alloy layer, the gold layer and the silicon nitride film layer, oxidation resistance of the connection lead 4 can be further enhanced, and the problem due to collision can be avoided.

In step S4, a protection adhesive layer 6 is formed on a side of the plurality of connection leads 4 away from the back plate 1, and the protective adhesive layer 6 covers the plurality of connection leads 4.

Exemplarily, the protection adhesive layer 6 further covers the first protection layer 7 and/or the second protection layer 8.

In some embodiments, the protection adhesive layer 6 may be formed by a spraying process, a deposition process, or the like. A material of the protection adhesive layer 6 may be selected from dark color resin materials, such as a black color resin material, a gray color resin material, a brown color resin material, a dark green color resin material, and the like.

In some embodiments, as shown in FIG. 14, the method for manufacturing a display panel further includes: forming a plurality of first electrodes 3 and a plurality of second electrodes 5 before forming the at least one connection lead 4 on the first main surface 1a, on the selected side surface 1cc and on the second main surface 1b in step S2. The forming the plurality of first electrodes 3 and the plurality of second electrodes 5 includes the following steps S1-1 and S1-2.

In step S1-1, a plurality of first electrodes 3 are formed on the second main surface 1b of the back plate 1. The plurality of first electrodes 3 are adjacent to at least one of the at least one side surface 1c, and at least one of the at least one side surface 1c is a selected side surface 1c.

In step S1-2, a plurality of second electrodes 5 are formed on the first main surface 1a of the back plate 1. The plurality of second electrodes 5 are adjacent to at least one of the at least one side surface 1c. The plurality of second electrodes 5 correspond one-to-one to the plurality of first electrodes 3 in a direction perpendicular to the first main surface 1a.

It should be noted that, the step of forming the plurality of first electrodes 3 in step S1-1 and the step of forming the plurality of second electrodes 5 in step S1-2 are not limited in the order.

In this case, in step S2, a plurality of connection leads 4 are formed on the first main surface 1a, on the selected side surface 1cc and on the second main surface 1b. One of the plurality of connection leads 4 is electrically coupled to one second electrode 5, and extends sequentially across the first main surface 1a, the selected side surface 1cc and the second main surface 1b to be electrically coupled to one first electrode 3.

In some embodiments, the plurality of first electrodes 3 and the driving circuits on the second main surface 1b may be formed in a single film forming process or in a single patterning process.

The above description is only for the specific embodiments of the present disclosure, but the scope of the present disclosure is not limited thereto, and any changes or substitutions that can be easily conceived by those skilled in the art within the technical scope of the present disclosure should be covered within the scope of the present disclosure. Therefore, the protection scope of the present disclosure should be subject to the protection scope of the claims.

What is claimed is:

1. A display panel, comprising:
   a back plate comprising a first main surface and a second main surface opposite to each other, and at least one side surface connecting between the first main surface and the second main surface, wherein the at least one side surface comprises a selected side surface;
   at least one connection lead on the selected side surface, wherein each of the at least one connection lead comprises a first buffer conductive layer, a main conductive layer and a second buffer conductive layer which are sequentially stacked on the back plate, and the connection lead comprising the first buffer conductive layer, the main conductive layer and the second buffer conductive layer which are sequentially stacked on the back plate extends from the first main surface, passes through the selected side surface and reaches onto the second main surface; and
   a first protection layer comprising a first portion on two sides of the main conductive layer of the connection lead in a width direction of the connection lead, wherein together with the main conductive layer of the connection lead, the first portion on the two sides of the main conductive layer of the connection lead in the width direction of the connection lead extends from the first main surface, passes through the selected side surface and reaches onto the second main surface, and the width direction of the connection lead is perpendicular to an extending direction of the connection lead,
   adhesiveness between the first buffer conductive layer and the back plate is greater than that between the main conductive layer and the back plate; and
   oxidation resistance of the second buffer conductive layer is greater than that of the main conductive layer.

2. The display panel of claim 1, further comprising a plurality of light emitting devices on the second main surface, wherein
   the connection lead extends and reaches to the first main surface and the second main surface, and is connected to a corresponding one of the plurality of light emitting devices; and
   the first protection layer further comprises a second portion and a third portion,
   the second portion is located on the two sides of the main conductive layer of a part on the first main surface and on the second main surface of the connection lead, and
   the third portion is located in a gap between the parts, on the first main surface, on the selected side surface, and on the second main surface, of every two adjacent connection leads of the at least one connection lead, and is located on a side of the connection lead away from a surface on which the connection lead is located.

3. The display panel of claim 2, wherein
   in a direction perpendicular to a surface, of the first main surface, the selected side surface, and the second main surface, on which the connection lead is located, the third portion has a thickness at the gap in a range from 0.2 μm to 0.5 μm, and a thickness at the connection lead in a range from 0.2 μm to 0.5 μm.

4. The display panel of claim 1, wherein
a material of the first buffer conductive layer and the second buffer conductive layer comprises at least one of titanium, chromium, molybdenum, or molybdenum niobium alloy; and
a material of the main conductive layer comprises copper, the main conductive layer has a thickness in a range from 0.4 μm to 1 μm in a direction perpendicular to a surface on which the main conductive layer is located, the first buffer conductive layer has a thickness in a range from 30 nm to 70 nm in a direction perpendicular to a surface on which the first buffer conductive layer is located, and the second buffer conductive layer has a thickness in a range from 50 nm to 120 nm in a direction perpendicular to a surface on which the second buffer conductive layer is located.

5. The display panel of claim 4, further comprising a protection adhesive layer covering the first protection layer.

6. The display panel of claim 1, wherein a thickness of the first portion in the width direction of the connection lead is in a range from 1 μm to 1.6 μm.

7. The display panel of claim 6, further comprising a plurality of light emitting devices on the second main surface, wherein
the connection lead extends and reaches to the first main surface and the second main surface, and is connected to a corresponding one of the plurality of light emitting devices, and
the display panel further comprises a second protection layer at least covering the connection lead and the first protection layer, and a material of the second protection layer comprises silicon nitride.

8. The display panel of claim 7, wherein
the first protection layer further comprises a second portion on two sides of the main conductive layer of a part on the first main surface and on the second main surface of the connection lead in the width direction of the connection lead.

9. The display panel of claim 7, further comprising a protection adhesive layer at least covering the first protection layer and the second protection layer.

10. A display apparatus, comprising:
a display panel, comprising: a back plate comprising a first main surface and a second main surface opposite to each other, and at least one side surface connecting between the first main surface and the second main surface, wherein the at least one side surface comprises a selected side surface; at least one connection lead on the selected side surface, wherein each of the at least one connection lead comprises a first buffer conductive layer, a main conductive layer and a second buffer conductive layer which are sequentially stacked on the back plate, and the connection lead comprising the first buffer conductive layer, the main conductive layer and the second buffer conductive layer which are sequentially stacked on the back plate extends from the first main surface, passes through the selected side surface and reaches onto the second main surface; and a first protection layer comprising a first portion on two sides of the main conductive layer of the connection lead in a width direction of the connection lead, wherein together with the main conductive layer of the connection lead, the first portion on the two sides of the main conductive layer of the connection lead in the width direction of the connection lead extends from the first main surface, passes through the selected side surface and reaches onto the second main surface, and the width direction of the connection lead is perpendicular to an extending direction of the connection lead; and
a driving chip on the first main surface of the back plate of the display panel, wherein the driving chip is electrically coupled to a plurality of light emitting devices of the display panel through the at least one connection lead of the display panel, respectively,
adhesiveness between the first buffer conductive layer and the back plate is greater than that between the main conductive layer and the back plate; and
oxidation resistance of the second buffer conductive layer is greater than that of the main conductive layer.

11. A splicing display apparatus, comprising a plurality of display apparatuses, each of which comprises the display apparatus of claim 10, wherein
the plurality of display apparatuses are assembled together by splicing.

12. A method for manufacturing a display panel, comprising:
providing a back plate, such that the back plate comprises a first main surface and a second main surface opposite to each other, at least one side surface connecting between the first main surface and the second main surface, and the at least one side surface comprises a selected side surface;
forming at least one connection lead on the selected side surface, such that each of the at least one connection lead comprises a first buffer conductive layer, a main conductive layer and a second buffer conductive layer are sequentially stacked on the back plate, and the connection lead comprising the first buffer conductive layer, the main conductive layer and the second buffer conductive layer which are sequentially stacked on the back plate extends from the first main surface, passes through the selected side surface and reaches onto the second main surface; and
forming a first protection layer, such that the first protection layer comprises a first portion on two sides of the main conductive layer of the connection lead in a width direction of the connection lead, and together with the main conductive layer of the connection lead, the first portion on the two sides of the main conductive layer of the connection lead in the width direction of the connection lead extends from the first main surface, passes through the selected side surface and reaches onto the second main surface, and the width direction of the connection lead is perpendicular to an extending direction of the connection lead,
adhesiveness between the first buffer conductive layer and the back plate is greater than that between the main conductive layer and the back plate; and
oxidation resistance of the second buffer conductive layer is greater than that of the main conductive layer.

13. The method of claim 12, wherein the forming a first protection layer comprises:
sputtering a silicon nitride material on two sides of the main conductive layer of the connection lead in the width direction of the connection lead to form the first protection layer.

14. The method of claim 12, wherein the forming a first protection layer comprises:
performing an electroless nickel/immersion gold process on the main conductive layer to form the first protection layer on two sides of the main conductive layer of the connection lead in the width direction of the connection lead.

15. The display panel of claim 1, wherein orthographic projections of the first buffer conductive layer and the second buffer conductive layer on the back plate are within an orthographic projection of the main conductive layer on the back plate.

* * * * *